(12) United States Patent
Easton et al.

(10) Patent No.: US 11,284,545 B2
(45) Date of Patent: Mar. 22, 2022

(54) SUBSTATION ELECTROMAGNETIC MITIGATION MODULE HOUSING INPUT/OUTPUT DEVICE

(71) Applicant: CenterPoint Energy, Inc., Houston, TX (US)

(72) Inventors: Eric D. Easton, Humble, TX (US); Kevin J. Bryant, Sugarland, TX (US)

(73) Assignee: CenterPoint Energy, Inc., Houston, TX (US)

( * ) Notice: Subject to any disclaimer, the term of this patent is extended or adjusted under 35 U.S.C. 154(b) by 0 days.

(21) Appl. No.: 17/083,896

(22) Filed: Oct. 29, 2020

(65) Prior Publication Data

US 2021/0045268 A1  Feb. 11, 2021

Related U.S. Application Data (62) Division of application No. 16/327,959, filed as application No. PCT/US2018/048428 on Aug. 29, 2018, now Pat. No. 10,856,453.

(60) Provisional application No. 62/583,373, filed on Nov. 7, 2017.

(51) Int. Cl.
| | |
|---|---|
| H02B 1/04 | (2006.01) |
| H02B 7/06 | (2006.01) |
| H05K 9/00 | (2006.01) |
| H02B 1/26 | (2006.01) |
| H04B 10/25 | (2013.01) |

(52) U.S. Cl.
CPC ............. *H05K 9/0007* (2013.01); *H02B 1/04* (2013.01); *H02B 1/26* (2013.01); *H02B 7/06* (2013.01); *H04B 10/25* (2013.01)

(58) Field of Classification Search
None
See application file for complete search history.

(56) References Cited

U.S. PATENT DOCUMENTS

| | | | |
|---|---|---|---|
| 8,090,057 B2 * | 1/2012 | Min | H04L 43/0823 |
| | | | 375/326 |
| 9,095,045 B2 | 7/2015 | Rojo et al. | |
| 9,562,938 B2 * | 2/2017 | Cox | G05B 9/02 |
| 10,199,821 B2 * | 2/2019 | Fuchs | H02H 7/04 |
| 2010/0145641 A1 * | 6/2010 | Bose | G01R 31/327 |
| | | | 702/58 |

(Continued)

FOREIGN PATENT DOCUMENTS

| | | |
|---|---|---|
| CA | 2 614 245 A1 | 1/2007 |
| CZ | 8 486 U1 | 6/1999 |
| KR | 101 794 163 B1 | 11/2017 |

OTHER PUBLICATIONS

EP Supplementary Search Report and Search Opinion dated Mar. 29, 2021.

(Continued)

*Primary Examiner* — Courtney L Smith
(74) *Attorney, Agent, or Firm* — Vorys, Sater, Seymour and Pease LLP (57) ABSTRACT

An electric power substation includes a circuit breaker, an electromagnetic pulse mitigation module coupled to the circuit breaker and comprising a continuous conductive enclosure that is impervious to radiated or coupled electromagnetic energy, an input/output device housed within the electromagnetic pulse mitigation module, and a control house communicably coupled to the circuit breaker via a primary communication line and housing one or more primary relay panels.

20 Claims, 6 Drawing Sheets

(56) References Cited

U.S. PATENT DOCUMENTS

| | | | | |
|---|---|---|---|---|
| 2010/0232082 | A1* | 9/2010 | Seger | F02M 31/13 |
| | | | | 361/211 |
| 2011/0012603 | A1* | 1/2011 | Bose | G06F 16/24568 |
| | | | | 324/418 |
| 2011/0254557 | A1* | 10/2011 | Makki | G01R 31/3274 |
| | | | | 324/418 |
| 2013/0000102 | A1* | 1/2013 | Heimann | H05K 9/0062 |
| | | | | 29/592.1 |
| 2013/0308229 | A1* | 11/2013 | Faxvog | H02H 3/338 |
| | | | | 361/35 |
| 2018/0061603 | A1* | 3/2018 | Hendrixson, III | H02J 3/00 |

* cited by examiner

SUBSTATION ELECTROMAGNETIC MITIGATION MODULE HOUSING INPUT/OUTPUT DEVICE

BACKGROUND

An electromagnetic pulse (EMP) is a super-energetic radio wave that has the capability of destroying, damaging, or causing the malfunction of electronic systems by overloading their circuits. During an EMP event (burst), such as high altitude electromagnetic pulses (HEMP) or intentional electromagnetic interference (IEMI), the metal incorporated into electrical devices is essentially turned into a receiving antenna for propagating EMP energy. The EMP energy is generally harmless to humans but can be catastrophic to critical infrastructure, such as electric power grids and telecommunications systems.

Electrical substations in most electric power grids are particularly susceptible to damage from EMP events. Electrical substations commonly include a control house (alternately referred to as a "cubicle"), which is a freestanding building structure with at least four walls, a roof, and a floor. The control house accommodates vital electrical equipment required to regulate operation of on-site circuit breakers. An EMP event can render such electrical equipment inoperable and effectively stop vital power supply to network customers.

One form of EMP that threatens proper operation of electrical substation control houses is radiated EMP energy waves, which propagate through free space until absorbed by metallic components of control house electrical equipment. Radiating EMP waves can be attenuated by encapsulating the entire control house in a continuous conductive shield, which provides an enclosure hardened against electromagnetic energy. Retrofitting existing control houses with a continuous conductive shield, however, is costly and oftentimes unfeasible due to the design requirement that the conductive shield also encapsulates the floor of the control house to fully protect vital relay equipment housed therein.

Another form of EMP that threatens electrical substation control houses is coupled EMP energy, which is absorbed by metallic conductors and carried to the control house electrical equipment via the metallic conductor. High-frequency coupled EMP energy can be mitigated by incorporating electrical filters, such as HEMP filters, which are wired into the conductors and operate to clip high amplitude signals. The conductors can also be shielded and grounded on both ends to mitigate primary electromagnetic threats. The use of shielded conductors, however, can produce secondary problems since the effectiveness of the shielding can be compromised in the presence of two grounds.

If the vast majority of electrical substations are unprotected from EMP threats, a widespread outage or failure due to electromagnetic interference could have disastrous effects. For these and other reasons, improvements are desirable.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

The present disclosure is related to mitigating electromagnetic threats to electrical power substations and, more particularly, to an electromagnetic pulse mitigation module that protects against radiated and coupled electromagnetic threats and serves as a backup to substation control house electrical equipment.

The embodiments discussed herein describe an electromagnetic pulse mitigation module that mitigates adverse effects of both radiated and coupled electromagnetic energy on electrical power substations. The electromagnetic pulse mitigation module may be activated when an event (e.g., an EMP burst) renders existing protective relay equipment at the substation inoperable. The electromagnetic pulse mitigation module may be designed to be impervious to damaging electromagnetic energy and may include backup protective relay equipment that can assume normal operation of the damaged existing protective relay equipment when needed. Accordingly, the electromagnetic pulse mitigation module may serve as a redundant feature of the substation that is capable of operating in place of damaged protective relay equipment.

Figure 1:
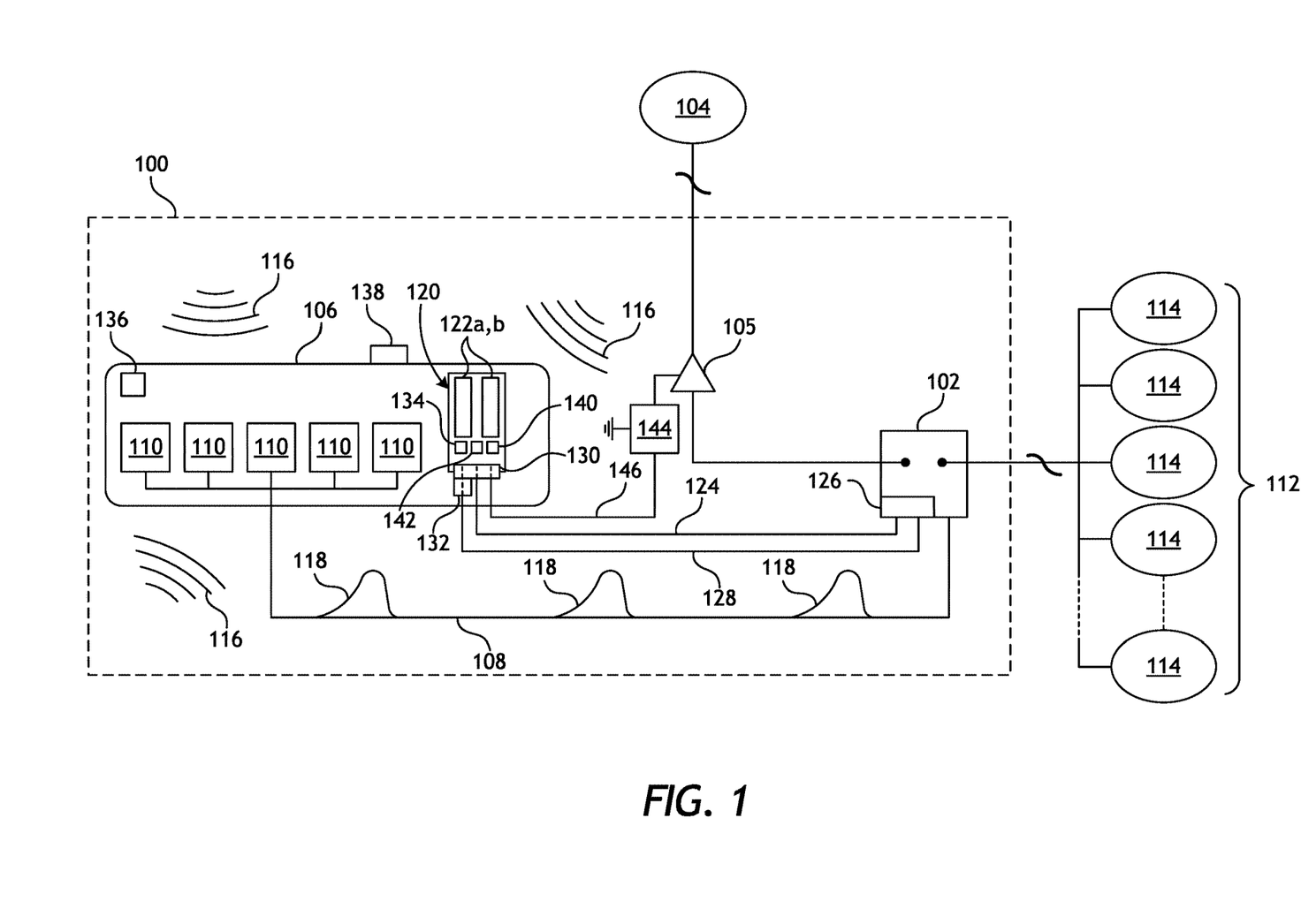
FIG. 1 is a generalized schematic of an example electric power substation that may incorporate the principles of the present disclosure

FIG. 1 is a schematic diagram of an example electric power substation 100 that may incorporate the principles of the present disclosure. As used herein, the term "electric power substation" or "substation" refers to an electric power facility such as, but not limited to, a transmission substation, a distribution substation, a power generation facility (including distributed generation), or any combination thereof. While the present disclosure is related generally to protecting substations and other electric power facilities, the principles described herein are equally applicable to other industries or applications, such as the telecommunications industry or any other industry requiring protection from EMP bursts or events.

As illustrated, the substation 100 may include at least one circuit breaker 102 that receives electrical power from a power plant 104 (alternately referred to as a "generator"). The substation 100 may also include one or more transformers 105 (one shown) that initially receive and condition the electrical power from the power plant 104 prior to receipt at the circuit breaker 102. In some embodiments, the circuit breaker 102 may be encased in a continuous conductive enclosure that is substantially or entirely impervious to radiated electromagnetic energy. In other embodiments, however, the circuit breaker 102 may be generally unprotected from radiated electromagnetic energy.

The circuit breaker 102 is communicably coupled to an on-site control house 106 via a primary communication line 108. The primary communication line 108 can comprise a plurality of conductors (e.g., copper wires) that facilitate electrical communication between the control house 106 and the circuit breaker 102. In some cases, the primary communication line 108 can include about 250 to about 270 conductors. One or more primary relay panels 110 are housed within the control house 106 and operate as protective relay and metering instruments that communicate with the circuit breaker 102 via the primary communication line 108. While five primary relay panels 110 are depicted in FIG. 1, more or less than five may be included in the substation 100, without departing from the scope of the disclosure.

During normal operation, the power plant 104 supplies high voltage electrical power to the circuit breaker 102. The electrical power is transmitted through the circuit breaker 102 and conveyed to a network 112 of power consumers 114, such as residential or commercial customers. The primary relay panels 110 monitor and measure the current and voltage conducted through the circuit breaker 102 to the network 112. If a fault or abnormality is detected, such as a decrease in voltage or an increase in current, the primary relay panels 110 send a trip command that opens the circuit breaker 102 and thereby isolates and protects the network 112 from electrical damage.

An electromagnetic pulse (EMP) burst can generate a high voltage difference in the electrical equipment of the substation 100, which can lead to high induced currents that may overload and render the primary relay panels 110 inoperable. In some cases, an EMP burst might generate radiated electromagnetic energy 116 capable of propagating through the walls of the control house 106 and potentially damaging the primary relay panels 110. In other cases, or in addition thereto, electromagnetic energy generated by an EMP burst may be absorbed by the primary communication line 108 and transmitted to the primary relay panels 110 in the form of coupled electromagnetic energy 118. The coupled electromagnetic energy 118 may also potentially damage the primary relay panels 110 or otherwise render them inoperable. If the primary relay panels 110 are damaged, power service (supply) to the power consumers 114 may cease, and electrical power transmission cannot be restored to the network 112 until the primary relay panels 110 are repaired or replaced.

To attenuate the radiated electromagnetic energy 116 from damaging the primary relay panels 110, the entire control house 106 can be encapsulated in a thick, six-sided metal enclosure, thus creating a continuous conductive shield. Vulnerabilities created by penetrations in the conductive shield can be mitigated with waveguides below cut-off. Retrofitting the control house 106 with a continuous conductive shield, however, can be cost-prohibitive and impractical since the design requires that the floor of the control house 106 also be enclosed.

To attenuate the coupled electromagnetic energy 118, one or more in-line filters may be wired to the conductor 108 to "clip" high amplitude signals so that they do not damage the connected relay panels 110. The conductor 108 may also be grounded and bonded at each end in an effort to dissipate the propagating energy. Grounding the conductor 108 at each end, however, can produce secondary problems such as circulating current resulting from degradation of the substation ground grid. These circulating currents may create signal noise on control cables and result in the malfunction or failure of protective relays. Moreover, the risk of circulating current might exist during normal operation, absent an EMP event, and can increase substation maintenance costs.

According to the present disclosure, the adverse consequences of subjecting the substation 100 to both radiated and coupled electromagnetic energy 116, 118 may be mitigated by incorporating an electromagnetic pulse mitigation module 120. The electromagnetic pulse mitigation module 120 (hereafter the "module 120") may be located on-site at the substation 100, such as housed within the control house 106. In other embodiments, however, the module 120 may be arranged at a location outside of the control house 106, without departing from the scope of the disclosure.

The module 120 houses one or more backup relay panels 122a and 122b that replicate the primary relay panels 110 within the control house 106. While only two backup relay panels 122a,b are depicted in FIG. 1, more or less than two may be employed, without departing from the scope of the disclosure. The backup relay panels 122a,b serve as an emergency redundancy to be activated when the primary relay panels 110 are rendered inoperable by an EMP event. For example, when an EMP burst disables the primary relay panels 110, operation of the substation 100 can be manually or automatically switched to the module 120 and the backup relay panels 122a,b will then assume the normal functions of the primary relay panels 110. Consequently, power disruption to the consumers 114 may be minimized or entirely avoided.

The module 120 may include a continuous conductive enclosure that is impervious to the radiated electromagnetic energy 116. Moreover, the module 120 may be communicably coupled to the circuit breaker 102 via a fiber optic line 124, thus also making the module 120 impervious to coupled electromagnetic energy 118. More specifically, optical fibers are electrically non-conductive, and as such, do not act as an antenna that picks up electromagnetic signals. Consequently, the backup relay panels 122a,b may be isolated during an EMP event that would otherwise disable or damage the primary relay panels 110.

In some embodiments, a merging unit 126 may be arranged at or within the circuit breaker 102 and may be configured to facilitate communication between the circuit breaker 102 and the module 120 via the fiber optic line 124. Accordingly, the merging unit 126 may at least partially operate as a fiber optic converter, and the module 120 may be primarily designed for fiber optic based relaying. While a typical control house (e.g., the control house 106) may include 16-20 individual relay panels (e.g., the primary relay panels 110), using fiber optic technology can condense the relay panels down into a size that can fit within the module 120. Consequently, the number of primary relay panels 110 and backup relay panels 122a,b may be dissimilar, but the backup relay panels 122a,b may nonetheless be able to assume some or all of the normal functions of each of the primary relay panels 110 when needed.

In some embodiments, and because of the fiber optic capability of the module 120, the primary relay panels 110 may be reduced in size to be accommodated within the module 120. In such embodiments, the module 120 may effectively operate as the control house 106 itself, and thereby eliminate the need for a redundant protective feature.

The fiber optic line 124 may be configured to operate in a manner similar to the primary communication line 108 in communicating with the circuit breaker 102. Accordingly, the fiber optic line 124 may be able to transmit data between the module 120 and the circuit breaker 102 and send a trip or close command to the circuit breaker 102 when needed.

In some embodiments, the fiber optic line 124 may include about twenty individual optical fibers, but could alternatively include more or less than twenty, without departing from the scope of the disclosure. In at least one embodiment, the fiber optic line 124 may have suitable fiber optic couplers at the merging unit 126 and the module 120 to facilitate clean and protected data communication between the two locations.

In some embodiments, a backup communication line 128 may also extend between and communicably couple the circuit breaker 102 to the module 120. As illustrated, the backup communication line 128 may extend from the merging unit 126. In at least one embodiment, the backup communication line 128 serves as a backup to the fiber optic line 124 in the event the merging unit 126 is damaged during an EMP burst. Accordingly, the backup communication line 128 may comprise an emergency redundant feature to the fiber optic line 124 and may be able to transmit a direct trip or close command to the circuit breaker 102 bypassing the merging unit 126, if necessary. In other embodiments, however, the backup communication line 128 and the fiber optic line 124 may operate simultaneously when the primary relay panels 110 fail or become inoperable.

Similar to the primary communication line 108, the backup communication line 128 may include a plurality of conductors made of a conductive material (e.g., copper), and may be shielded, grounded, and bonded to prevent coupled propagation of electromagnetic energy into the module 120. In some embodiments, the backup communication line 128 may include 15 to 20 conductors, but could alternatively include more or less than 15 to 20 conductors. In some embodiments, use of the conductive metallic conductors may be limited to device power to mitigate secondary problems associated with present designs utilizing multiple grounding points on shielded analog signal cables.

In some embodiments, the module 120 may include one or more waveguides below cut-off 130 (one shown) and the fiber optic line 124 may enter (penetrate) the interior of the module 120 via the waveguide below cut-off 130. The waveguide below cut-off 130 may be designed to shield the interior volume of the module 120 from exposure to the radiated electromagnetic energy 116 exceeding a predetermined magnitude and frequency. To accomplish this, the waveguide below cut-off 130 may have one or more honeycomb-shaped or otherwise stacked shapes and arranged apertures. The apertures of the waveguide below cut-off 130 may be selectively sized to filter signals up to a minimum of 10 GHz. In some embodiments, the module 120 may further include one or more ground lugs or ground clamps (see FIG. 2C) configured to help dissipate energy.

In some embodiments, the waveguide below cut-off 130 includes individual cells having a diameter sufficient for a cutoff frequency of 10 GHz minimum with minimum attenuation of 80 dB at this frequency. The seams between the module 120 and the waveguide below cut-off 130 may be continuously welded or an electromagnetically conductive gasket may be used to ensure continuous protection.

In some embodiments, a signal filter 132 may be coupled to the backup communication line 128 and arranged in-line to attenuate high frequency signals. Accordingly, the signal filter 132 may be configured to provide protection against power surges, such as those caused by EMP or intentional electromagnetic interference (IEMI). In one embodiment, the signal filter 132 is configured to filter electromagnetic signals carried on the backup communication line 128 to a minimum of 10 GHz. A number of commercially-available signal filters may be used to accomplish this. In at least one embodiment, for example, the signal filter 132 may comprise a HEMP filter.

In some embodiments, while the primary relay panels 110 are active and otherwise operational, the module 120 may remain inactive. In other embodiments, however, the module 120 may operate as a data collection device while the primary relay panels 110 operate. To accomplish this, the module 120 may include a remote terminal unit (RTU) 134 positioned within the module 120 and configured to undertake supervisory control and data acquisition (SCADA). The RTU 134 may serve as a backup to a primary RTU 136 that may be included in the control house 106 and associated with the primary relay panels 110. Accordingly, the backup RTU 134 may be configured to monitor and process some or all of the same data that is processed and monitored by the primary RTU 136.

Similar to the primary RTU 136, the backup RTU 134 may be configured to control power system devices and/or monitor and communicate power system measurements as well as statuses to remote locations for power system operation. For example, the backup RTU 134 may be programmed to obtain various system data points, such as mode, voltage, status of the circuit breaker 102 (i.e., open, closed, etc.), and other data. If there is a fault event, the data obtained by the backup RTU 134 will be able to show where the fault event occurred, the distance from the substation 100, and what the magnitude of the fault was. In the event the primary RTU 136 is damaged during an EMP burst, fault event data obtained by the primary RTU 136 may be lost, but the fault event data of the backup RTU 134 may be protected and accessible.

Data obtained by the backup RTU 134 may be transmitted to a remote operation center via a wired (e.g., fiber optic) or wireless telecommunications network. In some embodiments, the data obtained by the backup RTU 134 may be stored locally and may be obtained manually onsite, or may otherwise be transmitted on command or at predetermined intervals. In other embodiments, the data obtained by the backup RTU 134 may be transmitted continuously or intermittently to the remote operation center for consideration.

The control house 106 may include an intentional electromagnetic interference (IEMI) detector 138 for detecting spikes in radiating electromagnetic energy external to the control house 106. In some embodiments, the module 120 may further include a backup IEMI detector 140 positioned within the module 120. Since it is housed within the module 120, the backup IEMI detector 140 may be configured to monitor the shielding integrity of the module 120 and the environment outside the shield. If the backup IEMI detector 140 detects EMP energy (either radiated or coupled), that is an indication that the electromagnetic shield of the module 120 has been breached. No signal should be detected or transmitted as long as the electromagnetic shield provided by the module 120 remains intact (functioning). Rather, the IEMI detector 140 need only communicate when there is a breach. Moreover, there may not ever be a need to access the interior of the module 120 unless the IEMI detector 140 senses a breach.

In some embodiments, the module 120 may also include a power supply 142 configured to provide electrical power to various equipment included within the module 120, such as the backup RTU 134 and the IEMI detector 140. In some embodiments, the power supply 142 may also power the merging unit 126 via the backup communication line 128. In at least one embodiment, the power supply 142 may comprise a limited use direct current (DC) or alternating current (AC) system that includes an uninterruptable power supply (UPS) and batteries.

In some embodiments, the substation 100 may also include a geomagnetically induced current (GIC) sensor 144. Briefly, the GIC sensor 144 is communicably coupled to the transformer(s) 105 and in communication with a protective relay housed within the module 120 via a fiber optic cable 146. The GIC sensor 144 comprises a neutral current transformer providing direct current (DC) measurements to the protective relay, which monitors GIC values, such as sun storm bursts, and operates to trip the circuit breaker 102 (FIG. 1) before the current damages the power system auto transformer. Alternatively, the GIC monitoring system could produce an alarm to initiate assessment and action from a power system operator.

Example operation of the module 120 is now provided. The module 120 may be generally characterized as a passive device. More specifically, besides the data capture capabilities briefly described above, the module 120 essentially remains inactive until needed. The module 120 may be fully activated only when an EMP event has occurred and the primary relay panels 110 are damaged and/or otherwise rendered inoperable. Radiated electromagnetic energy 116 and/or coupled electromagnetic energy 118 may damage the primary relay panels 110, thereby resulting in a loss of electrical power (e.g., a black out) for the interconnected network 112. The EMP event that renders the primary relay panels 110 inoperable, will have little or no detrimental effect on the backup relay panels 122a,b within the module 120, which will remain undamaged as long as the electromagnetic shield of the module 120 remains intact.

Once the loss of electrical power at the substation 100 is reported or otherwise sensed, a repair crew may be dispatched to the substation 100. Upon determining that the primary relay panels 110 are damaged or inoperable, operation of the circuit breaker 102 may be transitioned to the module 120. In some embodiments, this can be done manually with the repair crew by closing switches that connect the control house 106 to the circuit breaker 102, and subsequently opening switches that enable connectivity to the module 120. Alternatively, transitioning operation of the circuit breaker 102 to the module 120 may be automated, such as from a remote location (e.g., a remote operation center) and using one or more servos or motors configured to open and close the appropriate switches.

The module 120 may be characterized as a redundant feature of the substation 100 that is capable of replacing (i.e., operating in place of) the electrical components of the control house 106 when needed. Until the primary relay panels 110 are restored or repaired, the module 120 may be used to facilitate power transmission to the network 112 through the circuit breaker 102. After the module 120 becomes operational, the repair crew (and/or the power company) may then coordinate between the power plant 104 and the required loads from the power consumers 114 to reestablish service on the network 112. The module 120 may help coordinate with the power plant 104 to begin to match power generation with the load on the network 112, an operation often referred to as a "black start generation."

Until the switch from the control house 106 to the module 120 is made, the module 120 may not have the ability to operate the circuit breaker 102. The module 120 may initially be configured as an online standby device, requiring no additional configuration for operational use beyond manual closing of switches. Following field trials, the module 120 might be used for normal operations in lieu of traditional protection and control methods.

Figure 2A:
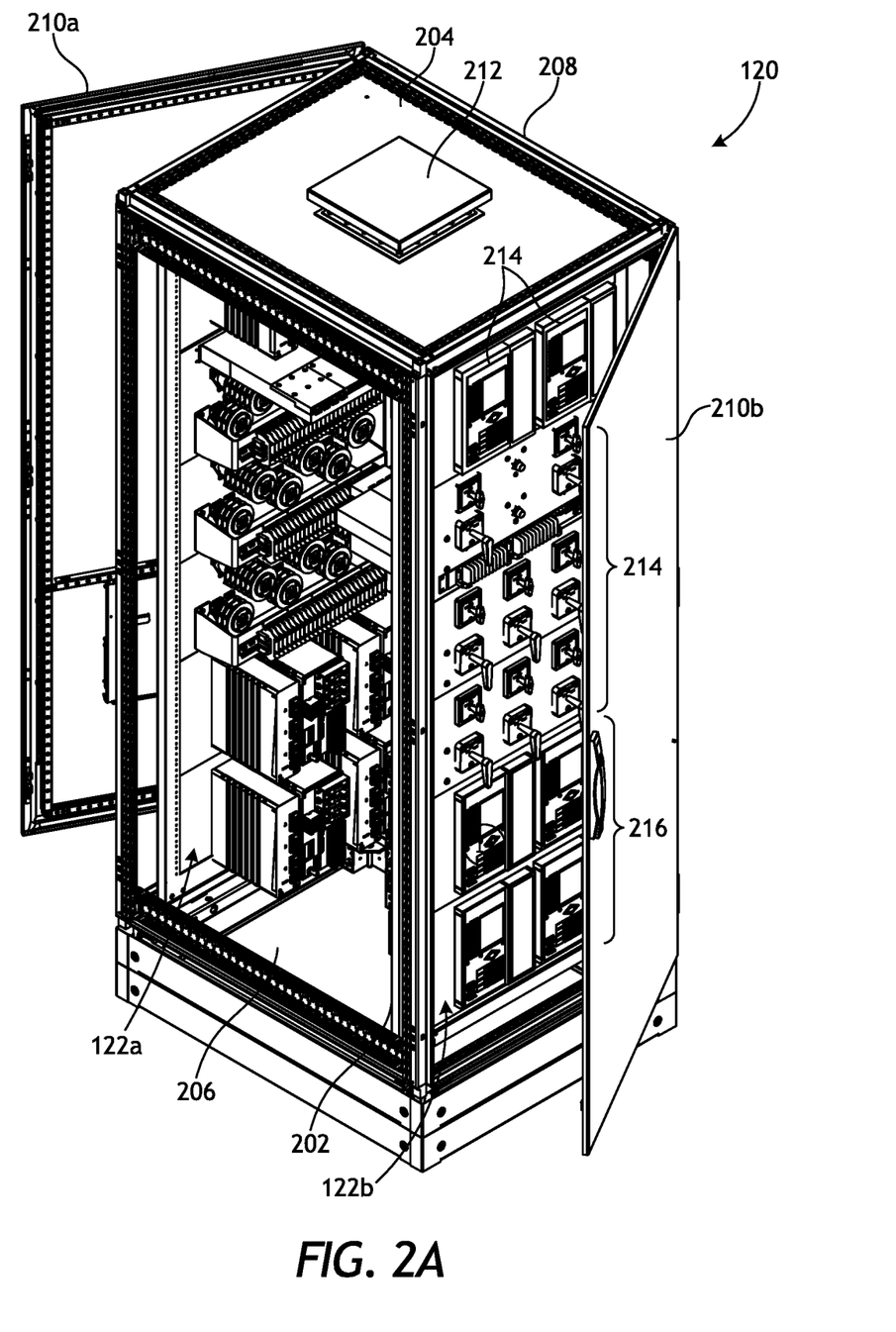
FIG. 2A is an isometric view of an example embodiment of the electromagnetic pulse mitigation module of FIG. 1.

FIG. 2A is an isometric view of an example embodiment of the module 120, according to one or more embodiments. As illustrated, the module 120 may exhibit a generally rectangular shape, but could alternatively be in any other polygonal or non-polygonal shape, without departing from the scope of the disclosure. For purposes of the present disclosure, however, the module 120 will be described herein as having six sides comprising a top, a bottom, and four sides that extend generally between the top and the bottom. More specifically, the module 120 may include a steel frame 202 to which is coupled a top 204, a bottom 206, a front wall (not shown), a back wall 208 (occluded), a first sidewall 210a, and a second sidewall 210b, collectively referred to herein as a "shell". The front wall is removed to enable viewing of the internal components of the module 120, but would otherwise be included to enable the shell to provide a continuous conductive enclosure for the protective relay and control equipment housed within the module 120.

The shell can be constructed from any electromagnetically conductive material. Suitable electromagnetically conductive materials include, but are not limited to, steel, aluminum, copper, and any combination thereof. In at least one embodiment, the electromagnetically conductive material may comprise conductive concrete, or concrete that is reinforced or iron impregnated to attenuate radiated EMP signals. In some embodiments, the electromagnetically conductive material may have a thickness sufficient to attenuate electromagnetic signals of 80 dB or more. In one embodiment for example, the thickness of the electromagnetically conductive material may range between about 3 mm and about 6 mm. In one embodiment, the electromagnetically conductive material may comprise steel plate of sufficient thickness to other hazards, such as ballistic threats. Any joints or seams formed at the intersection of two or more pieces of the shell may be continuously welded to provide for a complete electromagnetic shield.

The electronics included within the module 120 may require airflow for cooling purposes. To allow airflow from the exterior of the module 120 to pass into the protected internal region, a vent 212 may be installed in the module 120 and may extend through the shell. In the illustrated embodiment, the vent 212 is arranged on the top 204 but could alternatively be positioned at other locations on the shell. The vent 212 may include a waveguide beyond cutoff having one or more honeycomb-shaped or otherwise stacked shapes and arranged apertures configured to shield the interior volume of the module 120 from exposure to electromagnetic signals exceeding a predetermined acceptable magnitude and frequency.

The first and second sidewalls 210a,b may each comprise hinged doors capable of opening to expose or occlude the protective relay and control equipment arranged within the module 120. In the illustrated embodiment, for example, the first and second sidewalls 210a,b may be opened to expose the first backup relay panel 122a and the second backup relay panel 122b, respectively. As discussed above, the backup relay panels 122a,b effectively replicate the primary relay panels 110 (FIG. 1) and serve as an emergency redundancy to be activated when an event (e.g., an EMP burst) renders the primary relay panels 110 inoperable. Consequently, the backup relay panels 122a,b may be capable of assuming some or all of the normal functions of the primary relay panels 110 when needed.

The first and second backup relay panels 122a,b may include some or all of the same protective relay and control equipment. Accordingly, the following description of the second relay panel 122b may be equally applicable to the first relay panel 122a. As illustrated, the second backup relay panel 122b may include a plurality of relay switches 214 operable to open and close communication to the circuit breaker 102 (FIG. 1). While the relay switches 214 are shown as control handles, it will be appreciated that the relay switches 214 may alternatively comprise buttons or any other actuation mechanism that facilitates opening or closing communication with the circuit breaker 102. In some embodiments, the relay switches 214 may be manually operated, but could alternatively be automated using suitable servo motors or other electromechanical equipment that may be operated remotely.

The second backup relay panel 122b may further include a plurality of protective relays 216 configured to trip the circuit breaker 102 (FIG. 1) when a fault is detected. In at least one embodiment, one or more of the protective relays may comprise a protective relay device utilizing fiber optic communications.

Figure 2B:
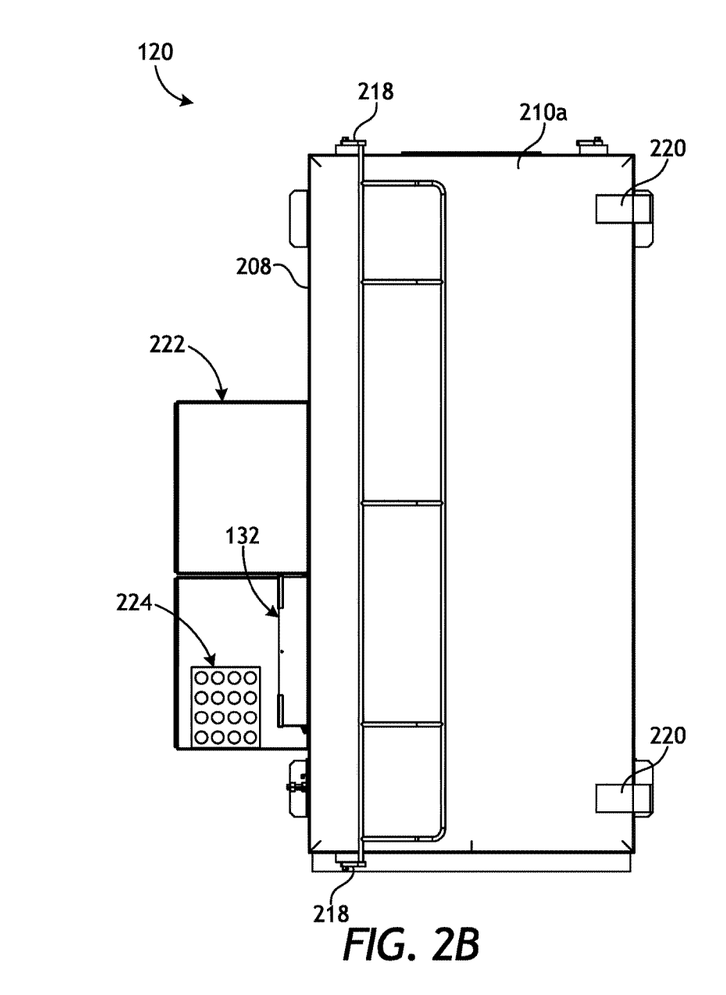
FIG. 2B is a schematic side view of the electromagnetic pulse mitigation module.

FIG. 2B is a schematic side view of the module 120, according to one or more embodiments, and depicts the first sidewall 210a. As illustrated, the first sidewall 210a may include one or more hinges 218 that facilitate pivoting movement of the first sidewall 210a between open and closed positions. In at least one embodiment, one or more latches 220 may be included on the first sidewall 210a to allow a user to manually open and/or close the second sidewall. When closed, the latches 220 secure the first sidewall 210a in the closed position. As will be appreciated, similar components and function may be equally applicable to the second sidewall 210b (FIG. 2A), but are not described herein for the sake of brevity.

Also depicted in FIG. 2B is a sub-enclosure 222 that may be mounted to the back wall 208 of the module 120, such as by being welded to the back wall 208. In some embodiments, a cable entry module 224 may be coupled to or otherwise included in the sub-enclosure 222. Alternatively, the cable entry module 224 may be mounted to the back wall 208, without departing from the scope of the disclosure. The cable entry module 224 provides a location where the backup communication line 128 (FIG. 1) may penetrate the module 120 and helps facilitate bonding and grounding of the backup communication line 128 to mitigate coupled energy propagation. Additionally, the cable entry module 224 may shield radiated energy at attenuation levels equal to the enclosure.

In some embodiments, the signal filter 132 may also be coupled to the back wall 208, but could alternatively be included at other locations on the module 120, without departing from the scope of the disclosure. As described above, the signal filter 132 may be configured to filter the power signals that enter the module 120, and thereby help prevent damage to electronic devices from coupled electromagnetic energy.

Figure 2C:
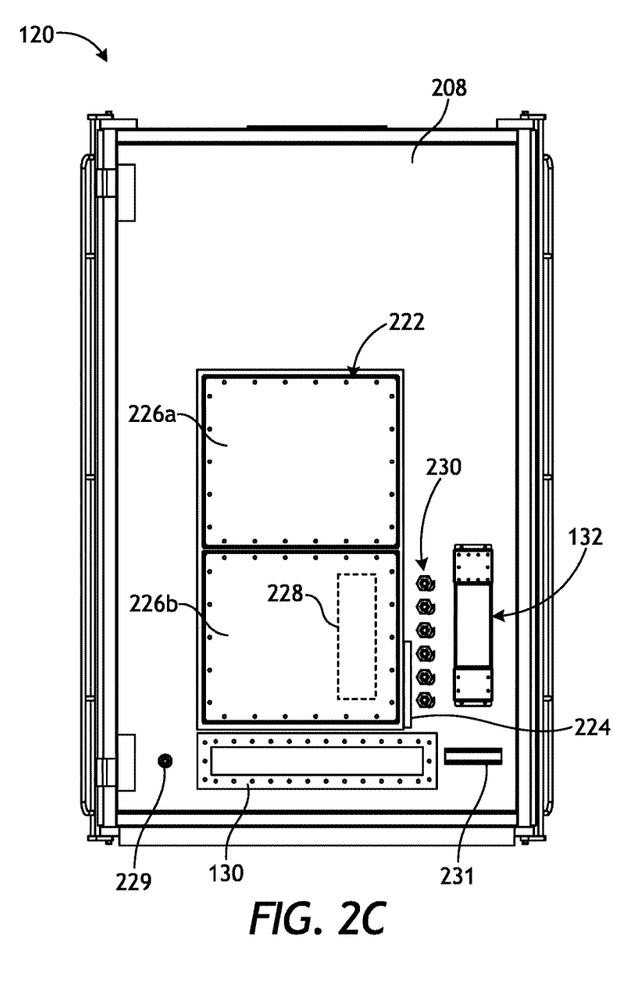
FIG. 2C is a schematic back view of the electromagnetic pulse mitigation module.

FIG. 2C is a schematic back view of the module 120, according to one or more embodiments, and depicts the back wall 208 of the module 120. In some embodiments, as illustrated, the sub-enclosure 222 may include an emergency sub-enclosure 226a and a power/control sub-enclosure 226b, and each may have a removable cover (panel) to access internal components of the sub-enclosure 222. The emergency sub-enclosure 226a may only be used in case of an emergency. The cover may be removed and the emergency sub-enclosure 226a may then provide access into the interior of the module 120, such as to run cables or the like into the interior. The power/control sub-enclosure 226b may include the cable entry module 224. Moreover, in some embodiments, an output signal filter 228 (shown in dashed lines) may be included in the power/control sub-enclosure 226b and may be used to route power out of the module 120. In some embodiments, for example, power routed out of the module 120 via the output signal filter 228 may power the merging unit 126 (FIG. 1). Similar to the signal filter 132, the output signal filter 228 filters the power signals so that coupled electromagnetic energy cannot penetrate the module 120 and damage internal electronic devices.

As illustrated, the waveguide below cut-off 130 may be arranged on the back wall 208 and may provide a location where one or more fiber optic lines (e.g., the fiber optic line 124 of FIG. 1) and/or conductors may pass into the interior of the module 120. In some embodiments, one or more fiber optic feedthrough ports 230 may also be mounted to the back wall 208 (or alternatively mounted to the sub-enclosure 222) and may also provide a location where one or more fiber optic lines (e.g., the fiber optic line 124 of FIG. 1) may pass into the interior of the module 120. In some embodiments, the waveguide below cut-off 130 and the fiber optic feedthrough ports 230 may help shield the interior volume of the module 120 from exposure to radiated electromagnetic energy 116 (FIG. 1) exceeding a predetermined magnitude and frequency.

As indicated above, the module 120 may further include one or more ground lugs 229 and/or one or more ground clamps 231, each of which may help dissipate energy from the module 120, as needed.

Figure 2D:
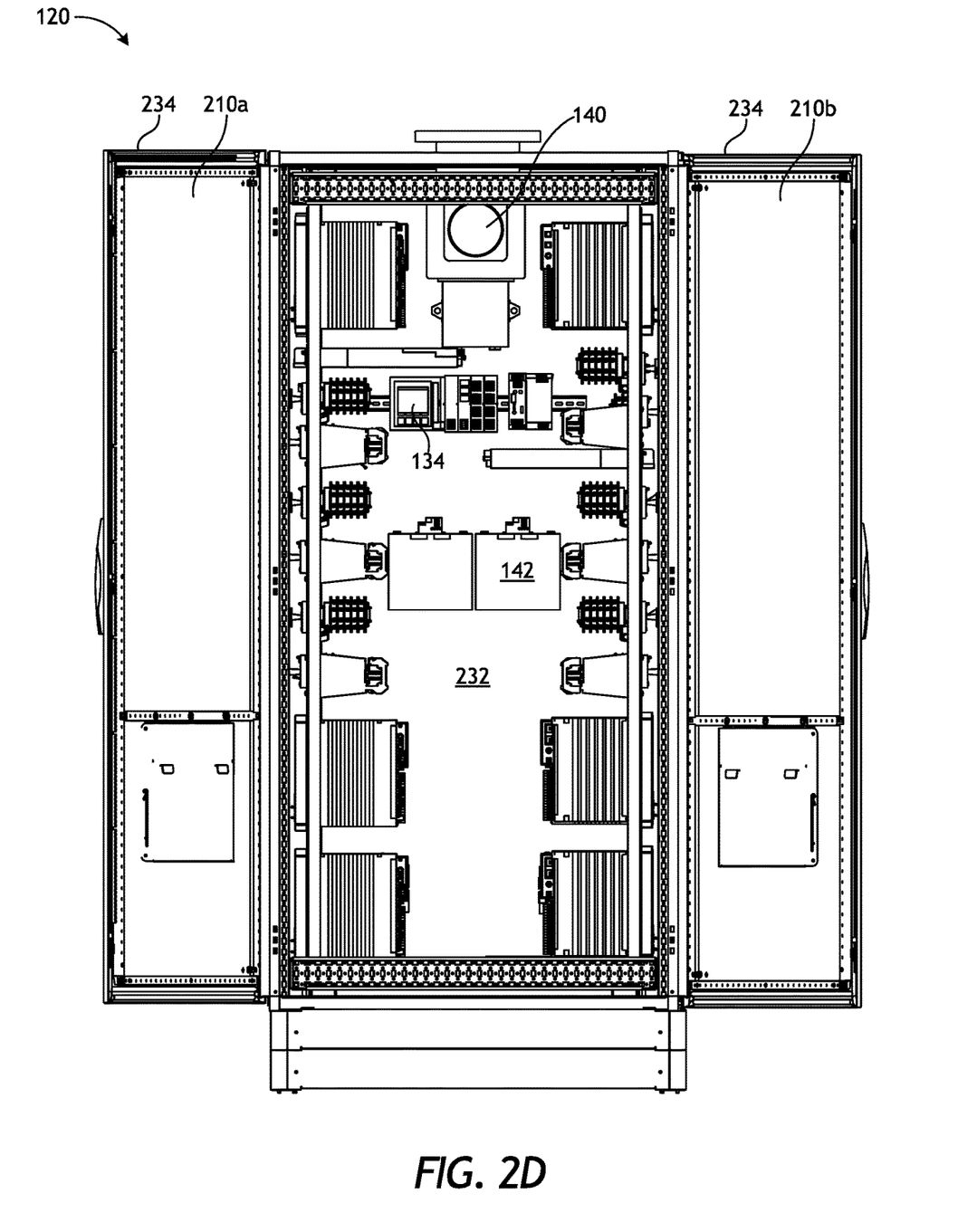
FIG. 2D is a schematic front view of the electromagnetic pulse mitigation module.

FIG. 2D is a schematic front view of the module 120, according to one or more embodiments, and depicts an interior 232 of the module 120 with the first and second sidewalls 210a,b in partially opened positions. As illustrated, the backup RTU 134, the backup IEMI detector 140, and the power supply 142 are all housed within the interior 232 of the module 120. As mentioned above, the IEMI detector 140 may be positioned within the interior 232 to continuously monitor the integrity of the shield and the environment outside the shield. In the event electromagnetic noise is sensed, the IEMI detector 140 may be configured to generate one or more alarms indicating the shielding effectiveness of the shell has been compromised or an external event has occurred. In some embodiments, these alarms may be stored on the RTU 134 within the shell and transmitted to system operations personnel for proactive repair of the module 120 shielding or response to an event at the substation.

In one or more embodiments, the first and second sidewalls 210a,b may incorporate a compressible finger stock 234 in a single or double "knife edge" configuration installed along the outer perimeter of the sidewalls 210a,b. As will be appreciated, the compressible finger stock 234 may prove advantageous in augmenting the EMP/HEMP shielding as required by the module 120.

Figure 3:
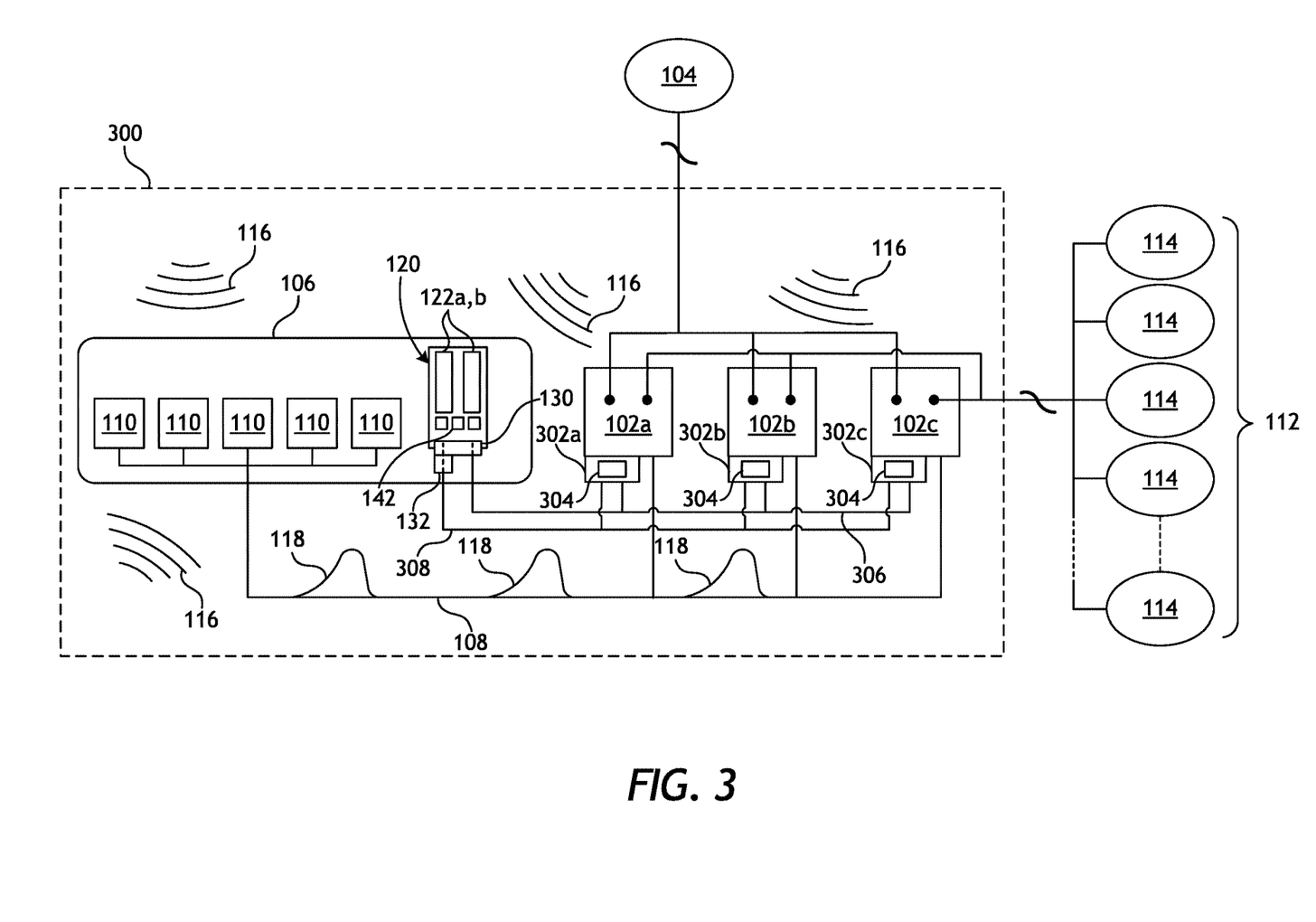
FIG. 3 is a schematic diagram of another example electric power substation that may incorporate one or more principles of the present disclosure.

FIG. 3 is a schematic diagram of another example electric power substation 300 that may incorporate one or more principles of the present disclosure. The substation 300 may be similar in some respects to the substation 100 of FIG. 1 and therefore may be best understood with reference thereto, where like numerals will represent like components not described again in detail. As illustrated, the substation 300 receives electrical power from the power plant 104 and includes the control house 106, which houses the primary relay panels 110.

Unlike the substation 100 of FIG. 1, however, the substation 300 includes multiple circuit breakers, shown as a first circuit breaker 102a, a second circuit breaker 102b, and a third circuit breaker 102c. While three circuit breakers 102a-c are depicted in FIG. 3, more or less than three may be employed, without departing from the scope of the disclosure. Each circuit breaker 102a-c may communicate with the primary relay panels 110 via the primary communication line 108. During normal operation, the power plant 104 supplies high voltage electrical power to the circuit breakers 102a-c, and the electrical power is transmitted through the circuit breakers 102a-c and conveyed to the network 112 of power consumers 114. In some embodiments, as illustrated, the circuit breakers 102a-c may jointly provide power to the network 112 via a single line. In other embodiments, however, one or more of the circuit breakers 102a-c may provide power independently. The primary relay panels 110 monitor and measure the current and voltage conducted through the circuit breakers 102a-c to the network 112. If a fault or abnormality is detected, the primary relay panels 110 send a trip command that opens one or more of the circuit breakers 102a-c and thereby isolates and protects the network 112 from electrical damage.

In some embodiments, one or more of the circuit breakers 102a-c may further include an electromagnetic pulse mitigation module, shown as a first module 302a, a second module 302b, and a third module 302c. Each module 302a-c may be used to help protect vital electrical equipment from both radiated and coupled electromagnetic energy 116, 118. In at least one embodiment, as illustrated, each module 302a-c may be attached or otherwise coupled to the exterior of the corresponding circuit breaker 102a-c. In other embodiments, however, one or more of the modules 302a-c may be arranged inside the corresponding circuit breaker 102a-c, without departing from the scope of the disclosure. While FIG. 3 depicts a module 302a-c associated with each circuit breaker 102a-c, it is contemplated herein that one or more of the circuit breakers 102a-c may not include an associated module 302a-c.

In some embodiments, the module 120 as generally described above may be included in the substation 300 and each module 302a-c may communicate with the module 120. Such embodiments may be referred to as a "centralized" solution. In other embodiments, however, the module 120 may be omitted and the modules 302a-c may include redundant features of the substation 300 that are capable of replacing (i.e., operating in place of) the electrical components of the control house 106 when needed. Such embodiments may be referred to as a "distributed" solution. In yet other embodiments, it is contemplated to have a combination centralized and distributed solution where the module 120 and the modules 302a-c each provide redundant features of the substation 300 capable of operating in place of the electrical components of the control house 106, without departing from the scope of the disclosure.

Each module 302a-c houses or otherwise contains an input/output device 304. In some embodiments, at least one of the input/output devices 304 (hereafter "I/O devices 304") may comprise a merging unit, similar to the merging unit 126 of FIG. 1. The I/O device 304 comprising the merging unit may communicate with the module 120 and the other I/O devices 304 via a fiber optic line 306, which may be similar to the fiber optic line 124 of FIG. 1. The fiber optic line 306 may be able to transmit data between the module 120 and the circuit breakers 102a-c and send a trip or close command to close the circuit breakers 102a-c when needed. Accordingly, the I/O device(s) 204 may at least partially operate as a fiber optic converter, and the modules 302a-c may be primarily designed for fiber optic based relaying.

In embodiments where the module 120 is omitted, or in addition to embodiments including the module 120, one or more of the I/O devices 304 may comprise backup relays that replicate the relays of the primary relay panels 110 within the control house 106. Similar to the backup relay panels 122a,b of the module 120, the backup relays of the I/O devices 304 may serve as an emergency redundancy to be activated when the primary relay panels 110 are rendered inoperable by an EMP event. When an EMP burst disables the primary relay panels 110, operation of the substation 300 can be manually or automatically switched to the modules 302a-c and the backup relays contained within the modules 302a-c will then assume the normal functions of the primary relay panels 110. Consequently, power disruption to the consumers 114 may be minimized or entirely avoided.

Similar to the module 120, each module 302a-c may include a continuous conductive enclosure that is impervious to the radiated electromagnetic energy 116. Moreover, since communication is facilitated via the fiber optic line 306, the modules 302a-c may also be impervious to coupled electromagnetic energy 118. In some embodiments, and because of the fiber optic capability of the modules 302a-c, the primary relay panels 110 may be reduced in size and accommodated within the modules 302a-c. In such embodiments, the modules 302a-c may effectively operate as the control house 106, and thereby eliminate the need for the control house 106 or redundant electrical components.

In some embodiments, a backup communication line 308 may also extend between the module 120 and the circuit breakers 102a-c. In embodiments omitting the module 120, the backup communication line 308 may extend only between the modules 302a-c. Similar to the primary communication line 108, the backup communication line 308 may include a plurality of conductors made of a conductive material (e.g., copper), and may be shielded, grounded, and bonded to prevent coupled propagation of electromagnetic energy into the modules 302a-c.

In at least one embodiment, the backup communication line 308 serves as a backup to the fiber optic line 306 in the event the I/O devices 304 (e.g., the merging units) are damaged during an EMP burst. Accordingly, the backup communication line 308 may comprise an emergency redundant feature to the fiber optic line 306 and may be able to transmit a trip or close command to the circuit breakers 102a-c when needed. In other embodiments, however, the backup communication line 308 and the fiber optic line 306 may operate simultaneously when the primary relay panels 110 fail or become inoperable.

In some embodiments, the modules 302a-c may include one or more waveguides below cut-off, and the fiber optic line 306 may enter (penetrate) the interior of the modules 302a-c via the waveguide below cut-off. The waveguides below cut-off may be similar to the waveguide below cutoff 130 of the module 120 and may operate comparably.

In some embodiments, one or more of the modules 302a-c may also include a signal filter coupled to the backup communication line 308 and arranged in-line to attenuate high frequency signals. The signal filter(s) may be similar to the signal filter 132 of the module 120 and thus configured to provide protection against power surges, such as those caused by EMP or intentional electromagnetic interference (IEMI).

In embodiments including the module 120, the power supply 142 may provide electrical power to the I/O devices 304 and other equipment included within the modules 302a-c via the backup communication line 308. In embodiments omitting the module 120, an independent power supply may be housed within an EMP hardened enclosure and coupled to the modules 302a-c via the communication line 308. In such embodiments, the power supply may be positioned within the control house 106 or any other location at the substation 300. In yet other embodiments, at least one of the modules 302a-c may include an independent power supply used to power each module 302a-c.

While not depicted in FIG. 3, it is contemplated herein that one or more of the modules 302a-c may further include a remote terminal unit (e.g., the RTU 134 of FIG. 1) configured to undertake supervisory control and data acquisition (SCADA). Moreover, one or more of the modules 302a-c may further include a backup IEMI detector (e.g., the backup IEMI detector 140 of FIG. 1). The backup IEMI detector may be configured to monitor the shielding integrity of the associated module 302a-c and communicate an alert signal when a breach of the continuous conductive enclosure is detected (measured).

The modules 302a-c may be fully activated when an EMP event has occurred and the primary relay panels 110 are damaged and/or otherwise rendered inoperable. Radiated electromagnetic energy 116 and/or coupled electromagnetic energy 118 may damage the primary relay panels 110, but will have little or no detrimental effect on the I/O devices 304 within the modules 302a-c, which will remain undamaged as long as the electromagnetic shield of the modules 302a-c remains intact. Until the primary relay panels 110 are restored or repaired, the modules 302a-c may be used to facilitate power transmission to the network 112 through the circuit breakers 102a-c.

Figure 4A:
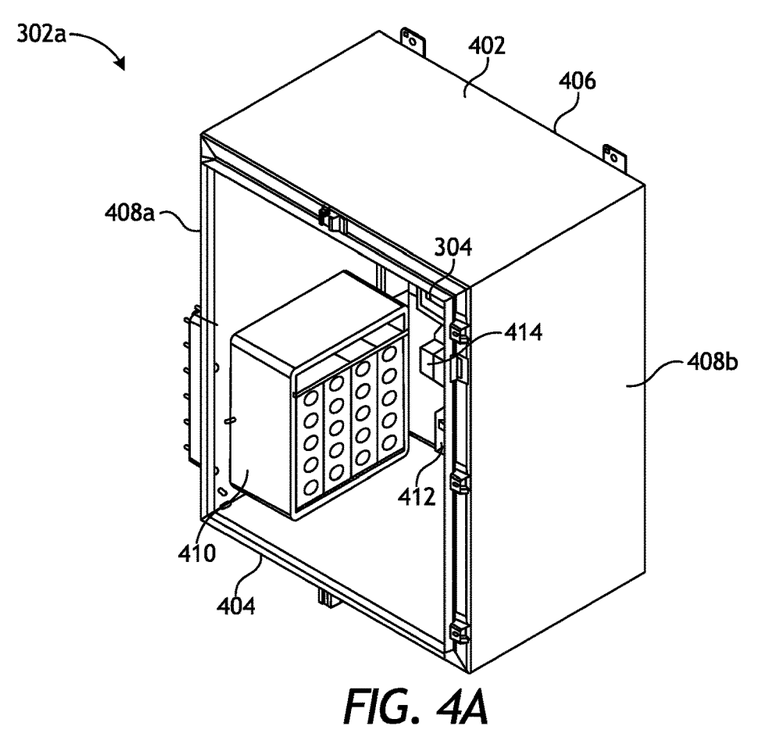
FIGS. 4A and 4B are isometric and front views, respectively, of an example embodiment of the first electromagnetic pulse mitigation module of FIG. 3, according to one or more embodiments.
Figure 4B:
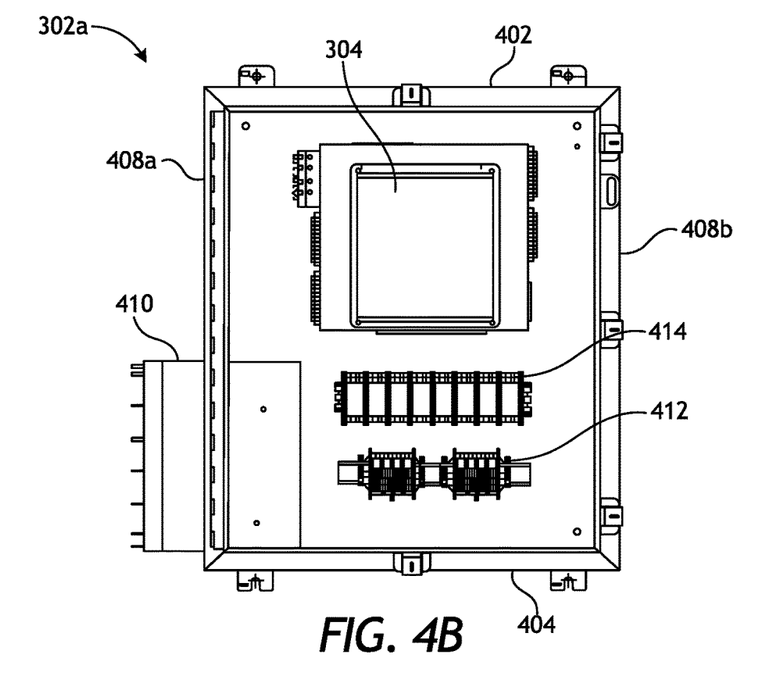

FIGS. 4A and 4B are isometric and front views, respectively, of an example embodiment of the first module 302a of FIG. 3, according to one or more embodiments. The first module 302a may be representative of any or all of the modules 302a-c of FIG. 3 and, therefore, the following description may be equally applicable to the second and third modules 302b,c. As illustrated, the module 302a may exhibit a generally rectangular shape, but could alternatively be in any other polygonal or non-polygonal shape, without departing from the scope of the disclosure. The module 302a may include a top 402, a bottom 404, a front wall (not shown), a back wall 406 (occluded), a first sidewall 408a, and a second sidewall 408b, collectively referred to herein as a "shell". The shell of the module 302a may be made of any of the materials mentioned herein with respect to the shell of the module 120 of FIGS. 2A-2D. In at least one embodiment, the module 302a may comprise a square box exhibiting 2 ft×2 ft dimensions, but could alternatively exhibit other dimensions without departing from the scope of the disclosure.

The front wall is omitted to enable viewing of the internal components of the module 302a, but would otherwise be included to enable the shell to provide a continuous conductive enclosure for the I/O device 304 and any other equipment housed within the module 302a. As indicated above, the I/O device 304 may comprise a merging unit similar to the merging unit 126 of FIG. 1. In other embodiments, or in addition thereto, the I/O device 304 may comprise one or more backup relays, such as relay switches (e.g., the relay switches 214 of FIG. 2A) and/or protective relays (e.g., the protective relays 216 of FIG. 2A).

A cable entry module 410 may penetrate the first sidewall 408a and provide a location where the fiber optic line 306 (FIG. 3) and the backup communication line 308 (FIG. 3) may enter the module 302a. One or more terminal blocks 412 may be positioned within the module 302a and used to route the fiber optic line 306 and the backup communication line 308 to and from the cable entry module 410. The cable entry module 410 helps facilitate bonding and grounding of shielded conductive cables, such as the backup communication line 308 (FIG. 3), to mitigate coupled energy propagation. Additionally, the cable entry module 410 may shield radiated energy at attenuation levels equal to the enclosure (i.e., the shell).

To protect the internal components of the module 302a from radiated and coupled electromagnetic energy 116, 118 (FIG. 3), the cable entry module 410 may include one or both of a waveguide below cut-off and a signal filter. The waveguide below cut-off may be designed to shield the interior volume of the module 302a from exposure to radiated electromagnetic energy exceeding a predetermined magnitude and frequency, such as signals up to a minimum of 10 GHz with minimum attenuation of 80 dB. The seams between the module 302a and the waveguide below cut-off may be continuously welded or an electromagnetically conductive gasket may be used to ensure continuous protection. The signal filter may be configured to filter electromagnetic signals carried on the backup communication line 308. The signal filter may be similar to the signal filter 132 of FIG. 1, and may be capable of filtering signals to a minimum of 10 GHz. In at least one embodiment, the signal filter may comprise a HEMP filter.

In some embodiments, the module 302a may further include one or more surge suppression devices 414 configured to protect the I/O device 304. Example surge suppression devices 414 include, but are not limited to, a metal-oxide varistor (MOV), a transient voltage suppressor (TVS) diode, and other functionally similar devices.

While the foregoing embodiments are related primarily to EMP events and blasts (bursts) that may disable certain electronic equipment of an electrical power substation, the principles of the present disclosure are equally applicable to scenarios where electronic equipment of an electrical power substation is damaged or otherwise rendered inoperable through other disaster events. Other disaster events can include, but are not limited to a flood, a fire, an earthquake, a sun burst, or any other event that might damage the existing relay panels. In such scenarios, the modules 120, 302a-c may further include one or more sensors that might detect such events. Accordingly, the presently described module is not limited to EMP events, but may instead be referred to as a generalized resiliency module since it can be resilient to multiple types of hazards.

Moreover, the modules 120, 302a-c may be positioned or otherwise equipped to withstand such events or hazards. For example, the modules 120, 302a-c may be mounted on shock absorbers to mitigate damaging vibration caused by earthquakes that would otherwise damage the protective relay equipment. The modules 120, 302a-c may also be fireproof to mitigate damage caused by fire. The modules 120, 302a-c may further be waterproof or otherwise arranged at a height to place the modules 120, 302a-c out of a flood plane to thereby mitigate damage caused by potential flooding.

Embodiments disclosed herein include:

A. An electric power substation that includes a circuit breaker that receives electrical power from a power plant, a control house communicably coupled to the circuit breaker via a primary communication line, wherein one or more primary relay panels are housed within the control house, an electromagnetic pulse mitigation module communicably coupled to the circuit breaker via a fiber optic line and comprising a continuous conductive enclosure that is impervious to radiated and coupled electromagnetic energy, and one or more backup relay panels housed within the electromagnetic pulse mitigation module and capable of assuming operation of the one or more primary relay panels.

B. An electric power substation that includes a circuit breaker that receives electrical power from a power plant, a control house communicably coupled to the circuit breaker via a primary communication line, wherein one or more primary relay panels are housed within the control house, an electromagnetic pulse mitigation module communicably coupled to the circuit breaker and comprising a continuous conductive enclosure that is impervious to radiated and coupled electromagnetic energy, and an input/output device housed within the electromagnetic pulse mitigation module.

C. A method of operating an electric power substation that includes receiving electrical power from a power plant at a circuit breaker located at the electrical power substation, wherein the electrical power substation includes a control house communicably coupled to the circuit breaker via a primary communication line, and wherein one or more primary relay panels are housed within the control house, transitioning operation of the circuit breaker to an electromagnetic pulse mitigation module communicably coupled to the circuit breaker via a fiber optic line and comprising a continuous conductive enclosure that is impervious to radiated and coupled electromagnetic energy, and assuming operation of the one or more primary relay panels with one or more backup relay panels housed within the electromagnetic pulse mitigation module.

Each of embodiments A, B, and C may have one or more of the following additional elements in any combination: Element 1: wherein the circuit breaker includes a merging unit that facilitates communication between the circuit breaker and the electromagnetic pulse mitigation module. Element 2: wherein the electromagnetic pulse mitigation module comprises a first electromagnetic pulse mitigation module and the substation further comprises a second electromagnetic pulse mitigation module communicably coupled to the circuit breaker and comprising a continuous conductive enclosure that is impervious to radiated and coupled electromagnetic energy, wherein the merging unit is located within the second electromagnetic pulse mitigation module. Element 3: further comprising a backup communication line that communicably couples the circuit breaker to the electromagnetic pulse mitigation module, wherein the backup communication line is shielded and grounded to prevent coupled propagation of electromagnetic energy into the electromagnetic pulse mitigation module. Element 4: a waveguide below cutoff coupled to the electromagnetic pulse mitigation module, wherein the fiber optic line penetrates the electromagnetic pulse mitigation module via the waveguide below cut-off, and a signal filter that filters signals in the backup communication line prior to entering the electromagnetic pulse mitigation module. Element 5: further comprising one or more of a remote terminal unit positioned within the electromagnetic pulse mitigation module to undertake supervisory control and data acquisition, an intentional electromagnetic interference detector positioned within the electromagnetic pulse mitigation module, and a power supply positioned within the electromagnetic pulse mitigation module. Element 6: wherein the continuous conductive enclosure is made of an electromagnetically conductive material selected from the group consisting of steel, aluminum, copper, conductive concrete, and any combination thereof. Element 7: wherein the input/output device comprises at least one of a merging unit and one or more backup relay panels capable of assuming operation of the one or more primary relay panels. Element 8: further comprising a surge suppression device housed within the electromagnetic pulse mitigation module to protect the input/output device. Element 9: wherein the continuous conductive enclosure is made of an electromagnetically conductive material selected from the group consisting of steel, aluminum, copper, conductive concrete, and any combination thereof. Element 10: wherein the circuit breaker comprises a plurality of circuit breakers and the electromagnetic pulse mitigation module comprises a plurality of electromagnetic pulse mitigation modules each coupled to a corresponding one of the plurality of circuit breakers, wherein the substation further comprises a fiber optic line that facilitates communication between the plurality of circuit breakers, and a backup communication line extending between the plurality of electromagnetic pulse mitigation modules, wherein the backup communication line is shielded and grounded to prevent coupled propagation of electromagnetic energy into the plurality of electromagnetic pulse mitigation modules. Element 11: further comprising a waveguide below cutoff coupled to each electromagnetic pulse mitigation module, wherein the fiber optic line penetrates the plurality of electromagnetic pulse mitigation modules via the waveguide below cut-off, and a signal filter that filters signals in the backup communication line prior to entering each electromagnetic pulse mitigation module. Element 12: wherein the electromagnetic pulse mitigation module comprises a first electromagnetic pulse mitigation module and the substation further comprises a second electromagnetic pulse mitigation module communicably coupled to the first electromagnetic pulse mitigation module via a fiber optic line and comprising a continuous conductive enclosure that is impervious to radiated and coupled electromagnetic energy, and one or more backup relay panels housed within the second electromagnetic pulse mitigation module and capable of assuming operation of the one or more primary relay panels, wherein the input/output device comprises a merging unit that facilitates communication between the circuit breaker and the second electromagnetic pulse mitigation module. Element 13: further comprising a backup communication line that communicably couples the first electromagnetic pulse mitigation module to the second electromagnetic pulse mitigation module, wherein the backup communication line is shielded and grounded to prevent coupled propagation of electromagnetic energy into the first or second electromagnetic pulse mitigation modules. Element 14: further comprising a first waveguide below cutoff coupled to the first electromagnetic pulse mitigation module, a second waveguide below cutoff coupled to the second electromagnetic pulse mitigation module, wherein the fiber optic line penetrates the first and second electromagnetic pulse mitigation modules via the first and second waveguides below cut-off, respectively, and a signal filter that filters signals in the backup communication line prior to entering each electromagnetic pulse mitigation module.

Element 15: facilitating communication between the circuit breaker and the electromagnetic pulse mitigation module with a merging unit included in the circuit breaker. Element 16: wherein the electromagnetic pulse mitigation module comprises a first electromagnetic pulse mitigation module and the method further comprises housing the merging unit within a second electromagnetic pulse mitigation module communicably coupled to the circuit breaker and comprising a continuous conductive enclosure that is impervious to radiated and coupled electromagnetic energy. Element 17: further comprising communicably coupling the circuit breaker to the electromagnetic pulse mitigation module with a backup communication line that is shielded and grounded to prevent coupled propagation of electromagnetic energy into the electromagnetic pulse mitigation module. Element 18: further comprising penetrating the electromagnetic pulse mitigation module the fiber optic line via a waveguide below cutoff coupled to the electromagnetic pulse mitigation module, and filtering signals in the backup communication line with a signal filter prior to entering the electromagnetic pulse mitigation module.

By way of non-limiting example, exemplary combinations applicable to A, B, and C include: Element 1 with Element 2; Element 3 with Element 4; Element 7 with Element 8; Element 10 with Element 11; Element 12 with Element 13; Element 13 with Element 14; Element 15 with Element 16; and Element 17 with Element 18.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. An electric power substation, comprising:
    a circuit breaker;
    an electromagnetic pulse mitigation module coupled to the circuit breaker and comprising a continuous conductive enclosure that is impervious to radiated or coupled electromagnetic energy;
    an input/output device housed within the electromagnetic pulse mitigation module; and
    a control house communicably coupled to the circuit breaker via a primary communication line and housing one or more primary relay panels.

2. The substation of claim 1, wherein the input/output device comprises a merging unit and the electromagnetic pulse mitigation module comprises a first electromagnetic pulse mitigation module, the substation further comprising:
    a second electromagnetic pulse mitigation module communicably coupled to the first electromagnetic pulse mitigation module via a fiber optic line and comprising a continuous conductive enclosure that is impervious to the radiated or coupled electromagnetic energy; and
    one or more backup relay panels housed within the second electromagnetic pulse mitigation module and capable of assuming operation of the one or more primary relay panels,
    wherein the merging unit communicates with the second electromagnetic pulse mitigation module via the fiber optic line.

3. The substation of claim 2, further comprising a backup communication line that communicably couples the first electromagnetic pulse mitigation module to the second electromagnetic pulse mitigation module, wherein the backup communication line is shielded and grounded to prevent coupled propagation of electromagnetic energy into the second electromagnetic pulse mitigation module.

4. The substation of claim 3, further comprising:
    a first waveguide below cutoff coupled to the first electromagnetic pulse mitigation module;
    a second waveguide below cutoff coupled to the second electromagnetic pulse mitigation module, wherein the fiber optic line penetrates the first and second electromagnetic pulse mitigation modules via the first and second waveguides below cut-off, respectively; and
    a signal filter that filters signals in the backup communication line prior to entering each electromagnetic pulse mitigation module.

5. The substation of claim 2, further comprising a power supply positioned within the second electromagnetic pulse mitigation module to provide electrical power to the merging unit.

6. The substation of claim 1, wherein the input/output device comprises one or more backup relay panels capable of assuming operation of the one or more primary relay panels.

7. The substation of claim 1, wherein the circuit breaker comprises a plurality of circuit breakers and the electromagnetic pulse mitigation module comprises a plurality of electromagnetic pulse mitigation modules each coupled to a corresponding one of the plurality of circuit breakers, and wherein the substation further comprises:
    a fiber optic line that facilitates communication between the plurality of electromagnetic pulse mitigation modules; and
    a backup communication line extending between the plurality of electromagnetic pulse mitigation modules, wherein the backup communication line is shielded and grounded to prevent coupled propagation of electromagnetic energy into the plurality of electromagnetic pulse mitigation modules.

8. The substation of claim 7, further comprising:
a waveguide below cutoff coupled to each electromagnetic pulse mitigation module, wherein the fiber optic line penetrates the plurality of electromagnetic pulse mitigation modules via the waveguide below cut-off of each electromagnetic pulse mitigation module; and
a signal filter coupled to each electromagnetic pulse mitigation module that filters signals in the backup communication line prior to entering each electromagnetic pulse mitigation module.

9. The substation of claim 1, further comprising:
a primary remote terminal unit in communication with the one or more primary relay panels and undertaking supervisory control and data acquisition; and
a backup remote terminal unit positioned within the electromagnetic pulse mitigation module and operable to assume operation of the primary remote terminal unit.

10. The substation of claim 1, further comprising a surge suppression device housed within the electromagnetic pulse mitigation module to protect the input/output device.

11. The substation of claim 1, wherein the continuous conductive enclosure comprises a frame having a top, a bottom, a front wall, a back wall, and first and second sidewalls, and wherein at least one of the first and second sidewalls comprises a hinged door.

12. A method of operating an electric power substation, comprising:
receiving electrical power from a power plant at a circuit breaker of the electric power substation, the electric power substation further including:
a merging unit housed within a first electromagnetic pulse mitigation module coupled to the circuit breaker;
a control house communicably coupled to the circuit breaker via a primary communication line and housing one or more primary relay panels;
a second electromagnetic pulse mitigation module communicably coupled to the merging unit via a fiber optic line, wherein the first and second electromagnetic pulse mitigation modules comprise a continuous conductive enclosure that is impervious to radiated or coupled electromagnetic energy; and
one or more backup relay panels housed within the second electromagnetic pulse mitigation module and capable of assuming operation of the one or more primary relay panels;
transitioning operation of the circuit breaker from the one or more primary relay panels to the second electromagnetic pulse mitigation module; and
assuming operation of the one or more primary relay panels with the one or more backup relay panels.

13. The method of claim 12, further comprising communicably coupling the first and second electromagnetic pulse mitigation modules with a backup communication line that is shielded and grounded to prevent coupled propagation of electromagnetic energy into the first and second electromagnetic pulse mitigation modules.

14. The method of claim 12, further comprising:
penetrating the first electromagnetic pulse mitigation module with the fiber optic line via a first waveguide below cutoff; and
penetrating the second electromagnetic pulse mitigation module with the fiber optic line via a second waveguide below cutoff.

15. The method of claim 12, further comprising:
filtering signals in the backup communication line with a first signal filter coupled to the first electromagnetic pulse mitigation module; and
filtering signals in the backup communication line with a second signal filter coupled to the second electromagnetic pulse mitigation module.

16. The method of claim 12, further comprising providing electrical power to the merging unit via a power supply positioned within the second electromagnetic pulse mitigation module.

17. A method of operating an electric power substation, comprising:
receiving electrical power from a power plant at a circuit breaker of the electric power substation, the electric power substation further including:
a control house communicably coupled to the circuit breaker via a primary communication line and housing one or more primary relay panels;
an electromagnetic pulse mitigation module coupled to the circuit breaker and comprising a continuous conductive enclosure that is impervious to radiated or coupled electromagnetic energy; and
one or more backup relay panels housed within the electromagnetic pulse mitigation module and capable of assuming operation of the one or more primary relay panels;
transitioning operation of the circuit breaker from the one or more primary relay panels to the electromagnetic pulse mitigation module; and
assuming operation of the one or more primary relay panels with the one or more backup relay panels.

18. The method of claim 17, wherein the electromagnetic pulse mitigation module is coupled to an exterior of the circuit breaker.

19. The method of claim 17, wherein the electromagnetic pulse mitigation module is arranged inside the circuit breaker.

20. An electric power substation, comprising:
a circuit breaker;
an electromagnetic pulse mitigation module coupled to the circuit breaker and comprising a continuous conductive enclosure that is impervious to radiated or coupled electromagnetic energy;
a merging unit with internal surge suppression housed within the electromagnetic pulse mitigation module; and
a control house communicably coupled to the circuit breaker via a primary communication line and housing one or more primary relay panels.

* * * * *